United States Patent
Frei et al.

(10) Patent No.: US 6,509,242 B2
(45) Date of Patent: Jan. 21, 2003

(54) HETEROJUNCTION BIPOLAR TRANSISTOR

(75) Inventors: Michel Ranjit Frei, Berkeley Heights, NJ (US); Clifford Alan King, New York, NY (US); Yi Ma, Orlando, FL (US); Marco Mastrapasqua, Annandale, NJ (US); Kwok K Ng, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/759,120

(22) Filed: Jan. 12, 2001

(65) Prior Publication Data

US 2002/0093031 A1 Jul. 18, 2002

(51) Int. Cl.[7] .................. H01L 21/331; H01L 31/0328; H01L 27/082
(52) U.S. Cl. ...................... 438/312; 438/360; 257/200; 257/565; 257/586
(58) Field of Search ................. 438/312, 359, 438/360, 316, 318; 257/197, 200, 201, 565, 586

(56) References Cited

U.S. PATENT DOCUMENTS

| | | | | |
|---|---|---|---|---|
| 5,258,642 A | * | 11/1993 | Nakamura | 257/514 |
| 5,285,088 A | * | 2/1994 | Sato et al. | 257/192 |
| 5,315,151 A | * | 5/1994 | Hsieh et al. | 257/592 |
| 5,323,032 A | * | 6/1994 | Sato et al. | 257/198 |
| 5,424,228 A | * | 6/1995 | Imai | 438/366 |
| 5,494,836 A | * | 2/1996 | Imai | 438/312 |
| 5,504,018 A | * | 4/1996 | Sato | 438/350 |
| 5,506,427 A | * | 4/1996 | Imai | 257/197 |
| 5,523,245 A | * | 6/1996 | Imai | 438/366 |
| 5,599,723 A | * | 2/1997 | Sato | 438/320 |
| 5,620,907 A | * | 4/1997 | Jalali-Farahani et al. | 438/320 |
| 5,620,908 A | * | 4/1997 | Inoh et al. | 438/207 |
| 5,698,890 A | * | 12/1997 | Sato | 257/592 |
| 5,882,976 A | * | 3/1999 | Blair | 438/309 |
| 5,895,248 A | * | 4/1999 | De Boer et al. | 438/341 |
| 5,897,359 A | * | 4/1999 | Cho et al. | 438/312 |
| 5,962,880 A | * | 10/1999 | Oda et al. | 257/198 |

OTHER PUBLICATIONS

C.A. King, "Heterojunction Bipolar Transistors With $Si_{1-x}Ge_x$ Alloys", Heterostructures and Quantum Devices, pp. 157–187, Jun. 1994.

C.A. King, "Integratabel and Low Base Ressistance Si/$Si_{1-x}Ge_x$ Heterojunction Bipolar Transistors Using Selective and Non–Selective Rapid Termal Epitaxy", IEDM 95, pp. 751–754.

C.A. King, "Very Low Cost Graded SiGe Base Bipolar Transistors for a High Performance Modular BiCMOS Process", IEDM 99, pp. 565–568.

* cited by examiner

Primary Examiner—Matthew Smith
Assistant Examiner—Lex H. Malsawma
(74) Attorney, Agent, or Firm—Richard J. Botos; John F. McCabe (57) ABSTRACT

A heterojunction bipolar transistor includes an emitter or collector region of doped silicon, a base region including silicon-germanium, and a spacer. The emitter or collector region form a heterojunction with the base region. The spacer is positioned to electrically insulate the emitter or collector region from an external region. The spacer includes a silicon dioxide layer physically interposed between the emitter or collector region and the remainder of the spacer.

18 Claims, 11 Drawing Sheets

HETEROJUNCTION BIPOLAR TRANSISTOR

BACKGROUND OF THE INVENTION

1. Field of the Invention

This invention relates generally to heterojunction bipolar transistors.

2. Discussion of the Related Art

A heterojunction is a type of semiconductor junction in which at least two adjacent regions are made of semiconductor materials with different bandgaps. For example, a heterojunction may have adjacent regions of silicon (Si) and strained silicon-germanium germanium ($Si_{1-x}Ge_x$), which have respective bandgaps of 1.12 eV and 1.2–0.7 eV, at room temperature. For a range of Ge molar fractions "x", e.g., 0.1<x <0.7, the adjacent Si and $Si_{1-x}Ge_x$, regions have different bandgaps and form a heterojunction.

In a heterojunction bipolar transistor (HBT), the difference in bandgaps strongly affects the transistor's gain. In normal operating configurations, the transistor's gain includes a factor of $exp(\Delta E_g/kT)$ where $\Delta E_g$ is the emitter bandgap minus the base bandgap, T is the temperature, and "k" is Boltzman's constant. If the emitter bandgap is larger than the base bandgap, the above-described exponential factor enhances the transistor's gain.

The factor $exp(\Delta E_g/kT)$ dominates the transistor's gain, at room temperature, if the difference between the emitter and base bandgaps is large, e.g., greater than 0.2–0.5 eV at 20° Centigrade. This difference is very large for HBTs with Si emitters and $Si_{1-x}Ge_x$, bases if the molar Ge fraction "x" is greater than about 0.1.

Interest in Si/Si—Ge heterojunction devices increased as techniques for growing crystalline Si—Ge layers that such devices use increased. Presently, epitaxy techniques enable growing strained crystalline Si—Ge layers on crystalline Si substrates. See e.g., J. C. Bean et al, Appl. Phys. Lett. 44 (1983) 102–104. Nevertheless, progress is still needed to produce smaller Si/Si—Ge HBTs with high quality operating characteristics.

BRIEF SUMMARY OF THE INVENTION

In one aspect, the invention features a process for forming a heterojunction device. The process includes forming one or more layers on a semiconductor substrate, forming a window in the layers to expose a portion of the substrate, and forming a silicon-germanium base region on the exposed portion of the substrate. The process also includes forming an emitter or collector region to cover the silicon-germanium base region, forming an oxide layer that covers the emitter or collector region, and forming a contact area on the emitter or collector region by removing a portion of the oxide layer.

In another aspect, the invention features a heterojunction bipolar transistor that includes an emitter or collector region of doped silicon, a base region including silicon-germanium, and a spacer. The emitter or collector region form a heterojunction with the base region. The spacer is positioned to electrically insulate the emitter or collector region from an external region. The spacer includes a silicon dioxide layer physically interposed between the emitter or collector region and the remainder of the spacer.

BRIEF DESCRIPTION OF THE SEVERAL VIEWS OF THE DRAWINGS

Like numbers indicate similar features in the figures.

DETAILED DESCRIPTION OF THE INVENTION

Epitaxy processes enable producing HBTs with thin and heavily doped Si—Ge bases on Si substrates. A Si—Ge base thickness of between about 7–100 nanometers (nm) generates low base transit times thereby increasing upper limits to operating frequencies for such HBTs. Increasing dopant levels in the base above those in the emitter lowers the base resistance to further raise the upper unity power gain frequency for such HBTs. For example, a Si/Si—Ge HBT with a base thickness of about 18 nm and higher dopant level in the base than in the emitter is capable of switching at frequencies in excess of 100 giga-Hertz.

Figure 1A:
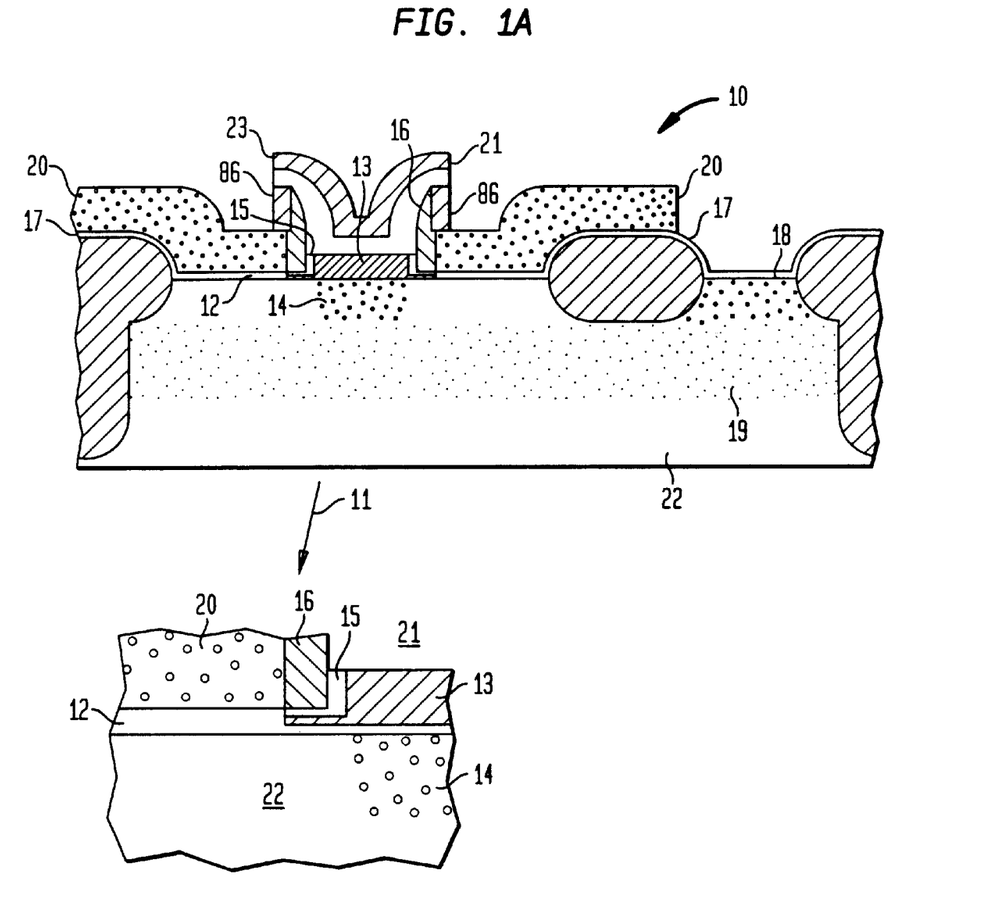
FIG. 1A is a cross-sectional view of one embodiment of a heterojunction bipolar transistor (HBT)

Referring to FIG. 1A, an NPN-type HBT 10 with a P-type $Si_{1-x}Ge_x$ base 12, an N-type Si emitter 13, and an N-type Si collector 14 is shown. The percentage "x" of Ge is either constant or graded across the width of the base 12. The emitter 13 is laterally surrounded by a composite self aligning spacer that includes a thermally grown silicon dioxide passifying layer 15 and a silicon nitride sidewall 16. The relations between passifying layer 15, nitride sidewall 16, emitter 13, and base 12 are show in more detail in insert 11, which is a magnified view of a portion of HBT 10.

The silicon dioxide passifying layer. 15 is interposed between the emitter 13 and the nitride sidewall 16. The presence of the oxide-passifying layer 15 reduces surface-induced carrier generation and recombination in the emitter-base space-charge region.

The emitter 13 is also positioned to physically separate the base 12 from the oxide passifying layer 15 so that portions of the Si—Ge base 12 near either the emitter 13 or collector 14 do not have an interface with a silicon oxide and/or nitride region. The absence of interfaces formed by oxidation of Si—Ge reduces carrier generation and recombination rates in the base/emitter or base/collector junctions, i.e., space-charge regions.

Base 12 does have a lateral interface with an oxide layer 17, but that interface is located at a large distance from portions of the base 12 that participate in minority carrier transport. The distance is at least two to three times the maximum thickness of the base 12. The largeness of the distance implies that the lateral surface does not significantly affect carrier generation or recombination rates in the base 12.

Base 12 has a crystalline strained Si—Ge lattice in which the molar fraction "x" of Ge is graded from a lower value at the interface with emitter 13 to a higher value at the interface with collector 14. Herein, a semiconductor region with a strained Si—Ge lattice has the same in-plane lattice constants as Si interfaces bordering the Si—Ge region. For example, the base 12 has a strained Si—Ge lattice, because its lattice constants parallel to interfaces with the emitter 13 and collector 14 equal those in crystalline Si regions.

In the base 12, the grading of the strained Si—Ge lattice structure bends the band that transports minority carriers. The bent band accelerates minority carriers located in the base 12 thereby reducing base transit times for such carriers. Reducing base transit times enables the HBT 10 to operate at higher frequencies.

Strained lattice growth limits the thickness of the base 12 to a maximum value dependant on the molar fraction "x" of Ge in the base 12. The thickness base 12 is generally less than about 7 nanometers (nm). Exemplary embodiments have maximum values of x equal to 0.6 and to 0.1 and corresponding base thicknesses of about 3 nm and about 80 nm. A preferred embodiment has a maximum value of x of about 0.3 and a base thickness of about 22 nm.

The base 12 is more heavily doped with P-type impurities than the emitter 13 is doped with N-type impurities. In exemplary embodiments, the base 12 has a dopant concentration of about $10^{19}$ to $10^{20}$ boron atoms per centimeter cubed ($cm^3$). The high dopant concentration in the base 12 reduces the base resistance.

In some embodiments, the base 12 also includes carbon atoms as dopants.

Crystalline Si emitter 13 has a thickness of between about 10 and 100 nm and a lower dopant concentration than base 12. An exemplary N-type dopant concentration for the emitter 13 is about $1 \times 10^{18}$ to $3 \times 10^{18}$ arsenic (As) atoms per $cm^3$.

The crystalline Si collector 14 is wider than either base 12 or emitter 13 and also has a lower dopant level, which is determined by breakdown voltage requirements. An exemplary N-type dopant concentration is $10^{15}$–$10^{18}$ phosphorus atoms per $cm^3$.

The collector 14 is in electrical contact with a contact region 18 via an N-type doped subcollector 19 located below the collector 14. The subcollector 19 has a thickness of about 1 micron or less and an N-type dopant concentration of about $10^{19}$–$5 \times 10^{20}$ phosphorus, arsenic, or antimony atoms per $cm^3$.

The base 12 and emitter 13 are in electrical contact with polysilicon base and emitter electrodes 20, 21, which have respective P-type and N-type dopants. The base electrode 20 and the emitter electrode 21 are physically separated laterally by about 20 to 100 nm of dielectric spacer, i.e., oxide layer 15 and sidewall 16. In one embodiment, the shortest distance between the base electrode 20 and the emitter 13 is about 40 nm.

In various embodiments, the thickness of the sidewall 16 is designed to make a compromise between a constraint imposed by the resistance of the base 12 and another constraint imposed by the capacitance between the base 12 and emitter 13. For high frequency performance, the base resistance should be low and base resistance typically increases with the thickness of the sidewall 16. On the other hand operation at high frequency needs the capacitance between the emitter 13 and base electrode 20 to be low and this capacitance decreases with the thickness of the sidewall 16. The 40 nm thick sidewall enables the HBT to operate at up to frequencies of about 105 Giga Hertz or higher.

Figure 1B:
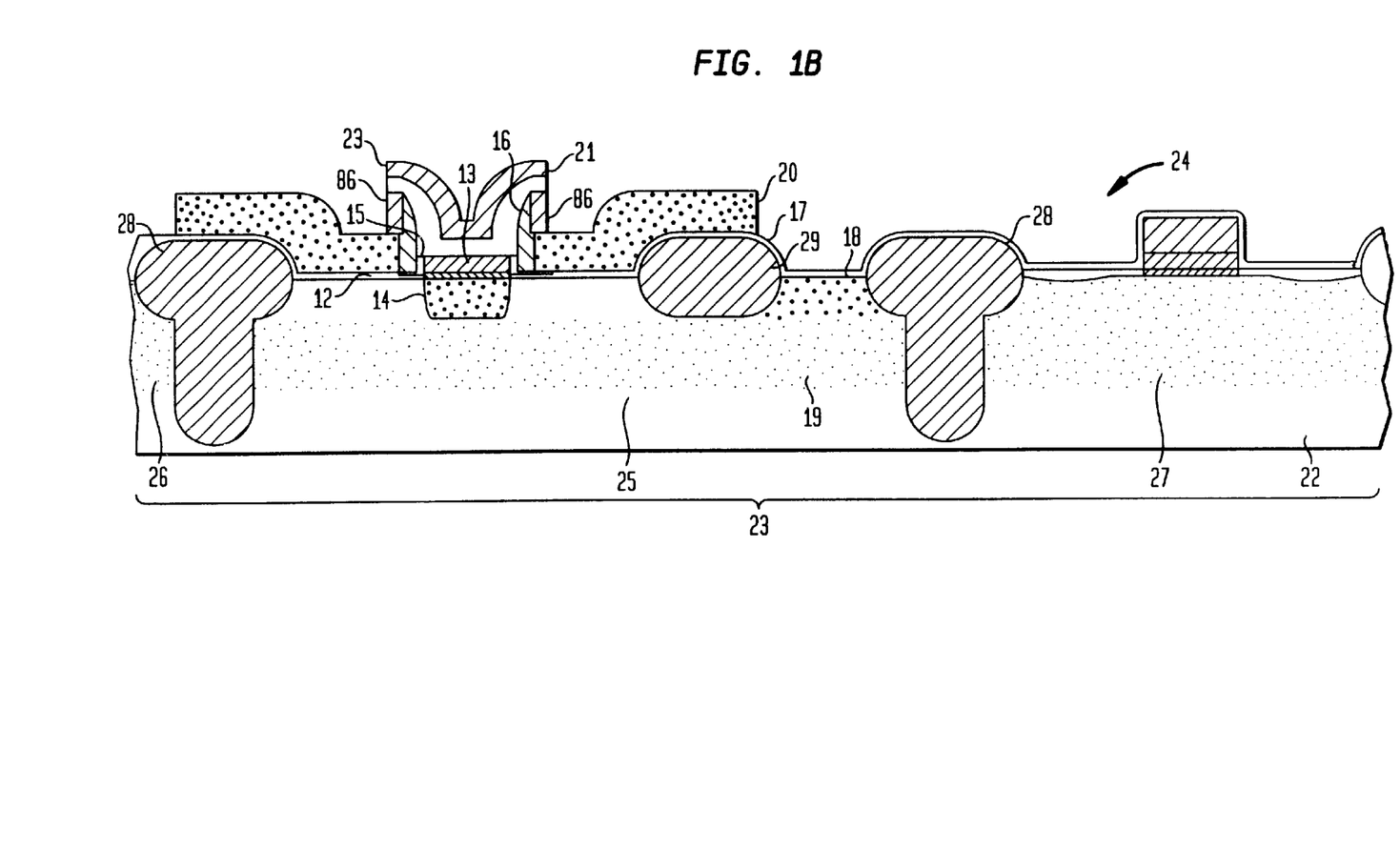
FIG. 1B is a cross-sectional view of a portion of an integrated circuit containing the HBT of FIG. 1A.

FIG. 1B shows a P-type silicon substrate 22 supporting an integrated circuit 23. The circuit 23 includes HBT 10 of FIG. 1A and one or more other active devices 24, e.g., a field effect transistor.

The P-type substrate 22 includes N-type doped wells 25, 26–27 in which HBT 10 and other devices 24 are located. The well 25 is electrically isolated from the lateral wells 26–27 by a deep oxide barrier 28, e.g., a field oxide that surrounds the well 25. A P-N junction isolates the well 25 from the portion of the substrate 22 below the well 25. Another oxide barrier 29 electrically insulates the HBT's base 12 from collector contact region 18.

Figure 2:
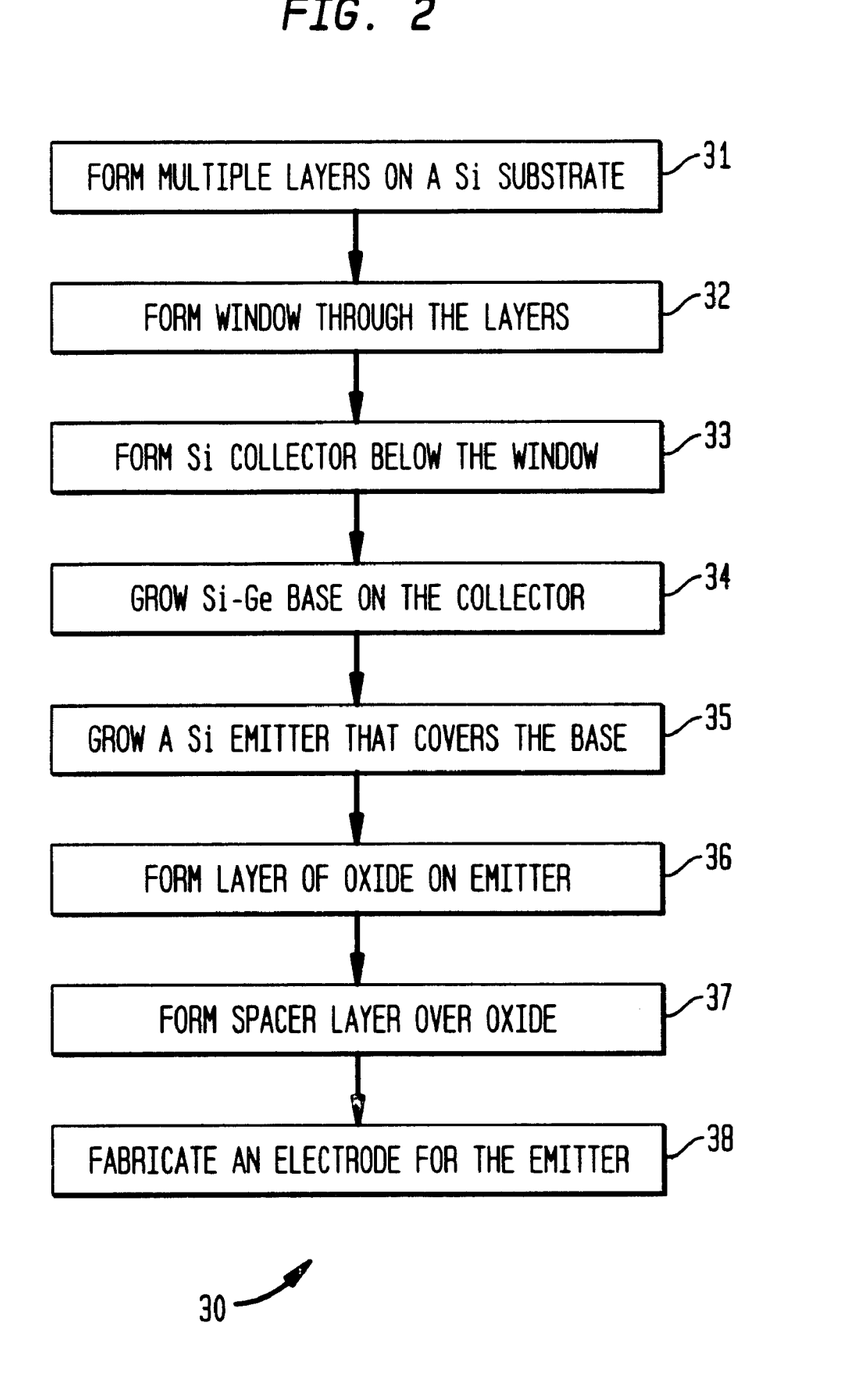
FIG. 2 is a flow chart showing a process for growing an HBT with an emitter region that is passified with respect to carrier recombination and generation.

FIG. 2 illustrates one embodiment of a process 30 for fabricating a Si/Si—Ge HBT with low carrier recombination and generation rates in base and emitter regions, e.g., base and emitter 12, 13 of FIGS. 1A–1B. The process 30 forms one or more layers on a Si substrate (step 31). The process 30 forms a window through the one or more layers to expose a portion of the substrate (step 32). The process 30 forms a crystalline Si collector region in the exposed portion of the substrate, e.g., by diffusion or implantation of dopant atoms and annealing (step 33).

On the previously formed collector region, the process 30 epitaxially grows a doped crystalline Si—Ge base region (step 34). The process 30 epitaxially grows a crystalline Si emitter region on the previously grown base region so that the emitter region covers the base region (step 35). After the second epitaxial growth, the Si—Ge base region is surrounded by silicon regions so that later processes do not oxidize portions of the Si—Ge base region. Thermal oxidation of portions of the Si—Ge base region could produce high generation and recombination rates in the base region due to the roughness of interfaces formed by the oxidation of Si—Ge alloy. In various embodiments, portions of the base region closer to the emitter region than about 2–4 times the maximum base thickness are covered by silicon to avoid subsequent oxidation.

As an example, base 12 of FIG. 1 is surrounded by emitter 13, collector 14, and polysilicon electrode 20. Only a small portion of the base 12 laterally touches an oxide layer 17. That portion of the base 12 is at a distance of at least twice the base thickness from regions of the base that participate in minority carrier transport, i.e., regions sandwiched between emitter 13 and collector 14. Thus, the interface of the base and oxide layer 17 does not significantly affect carrier recombination and generation rates in the base.

After removing the dielectric contacting the Si emitter region, the process 30 grows a passifying layer of silicon dioxide from the exposed surface of the Si emitter region (step 36). The passifying layer of silicon dioxide is either deposited or grown thermally. If grown thermally, the silicon dioxide growth process stops before material of the Si—Ge base region is oxidized, because oxidizing such material would produce a poor interface with high carrier recombination and generation rates. Furthermore, in a thermal growth of the passifying layer, the temperature is kept low, e.g., below 800° C., and the oxidation is performed in an atmosphere that contains both oxygen and water vapor. The process 30 completes formation of a lateral spacer around the emitter region, e.g., by depositing one or more additional dielectric layers (step 37). The previously grown oxide, e.g., a thermal oxide, protects the emitter region from direct contact with the later-deposited dielectric layers. Without the oxide layer, high carrier generation and recombination rates could result from a direct physical contact between the surface of the emitter region and later-deposited dielectrics such as silicon nitride. The process 30 fabricates an electrode on the previously formed emitter region and encapsulates the emitter region so that a high carrier recombination rate does not occur therein (step 38). The formation of the electrode may include one or more etches and depositions of other materials.

After formation of the emitter electrode, the Si emitter region is surrounded by semiconductor regions and thermally grown silicon dioxide. Interfaces with both type of region do not lead to unacceptably high carrier recombination rates in the emitter region. In the HBT 10 of FIGS. 1A–1B, emitter 13 is surrounded by polysilicon electrode 21, thermal oxide passifying layer 15, and Si—Ge base 12.

A layer of silicon dioxide over the emitter region improves operating properties of HBTs that have higher dopant levels in the base region than in the emitter region. For such HBTs, the depletion region is thicker in the emitter region than in the base region and is thus, more likely to completely cross the thickness of parts of the emitter region. For those parts of the emitter region, carrier recombination on exposed emitter surfaces can seriously degrade the transistor's operation. Covering those emitter surfaces with a layer of silicon dioxide, e.g., a thermally grown layer, reduces carrier recombination rates below rates occurring on similar surfaces that do not have a protective oxide layers.

Figure 3A:
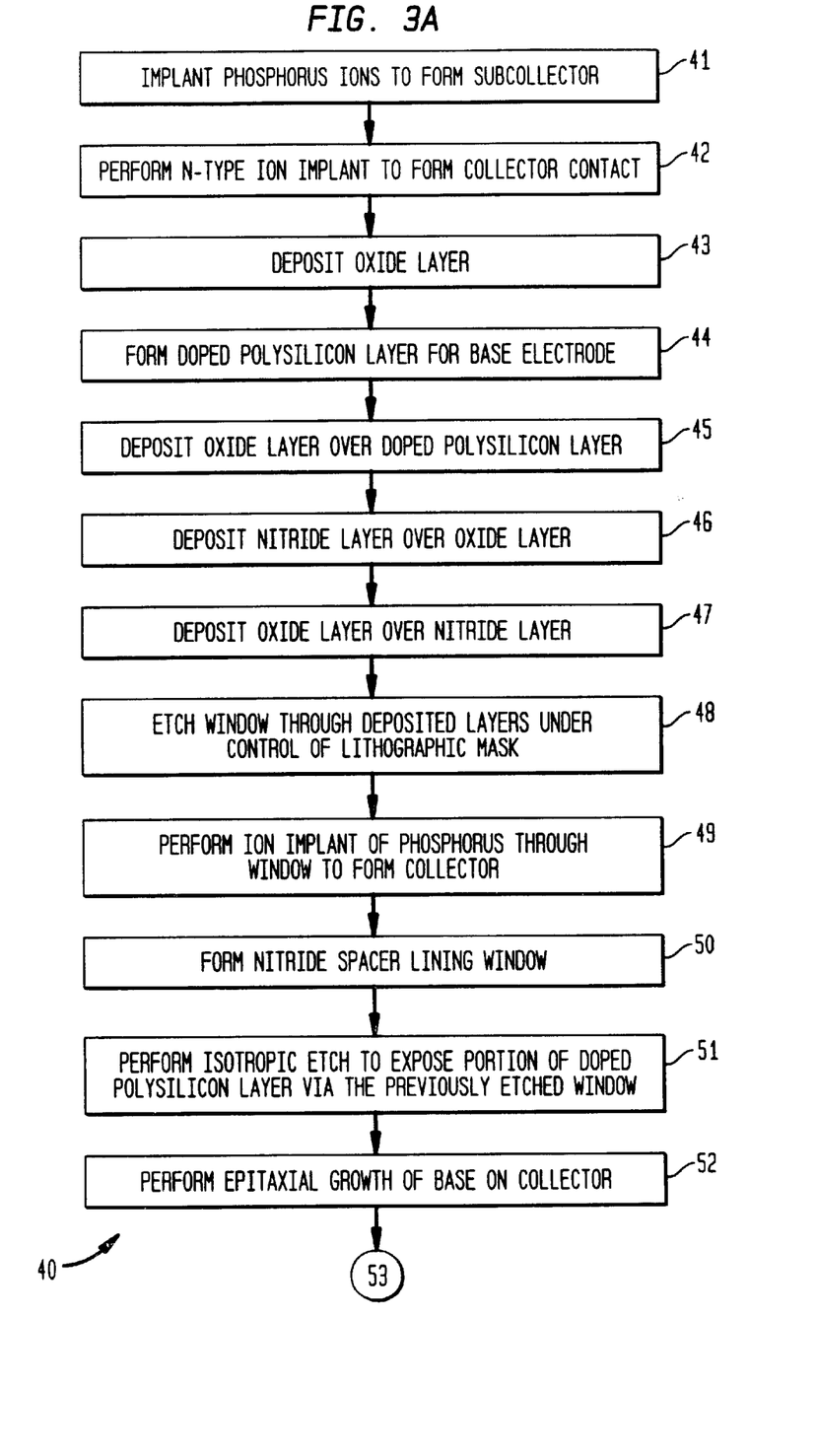
FIGS. 3A–3B are flowcharts showing a process for fabricating the HBT of FIGS. 1A–1B.
Figure 3B:
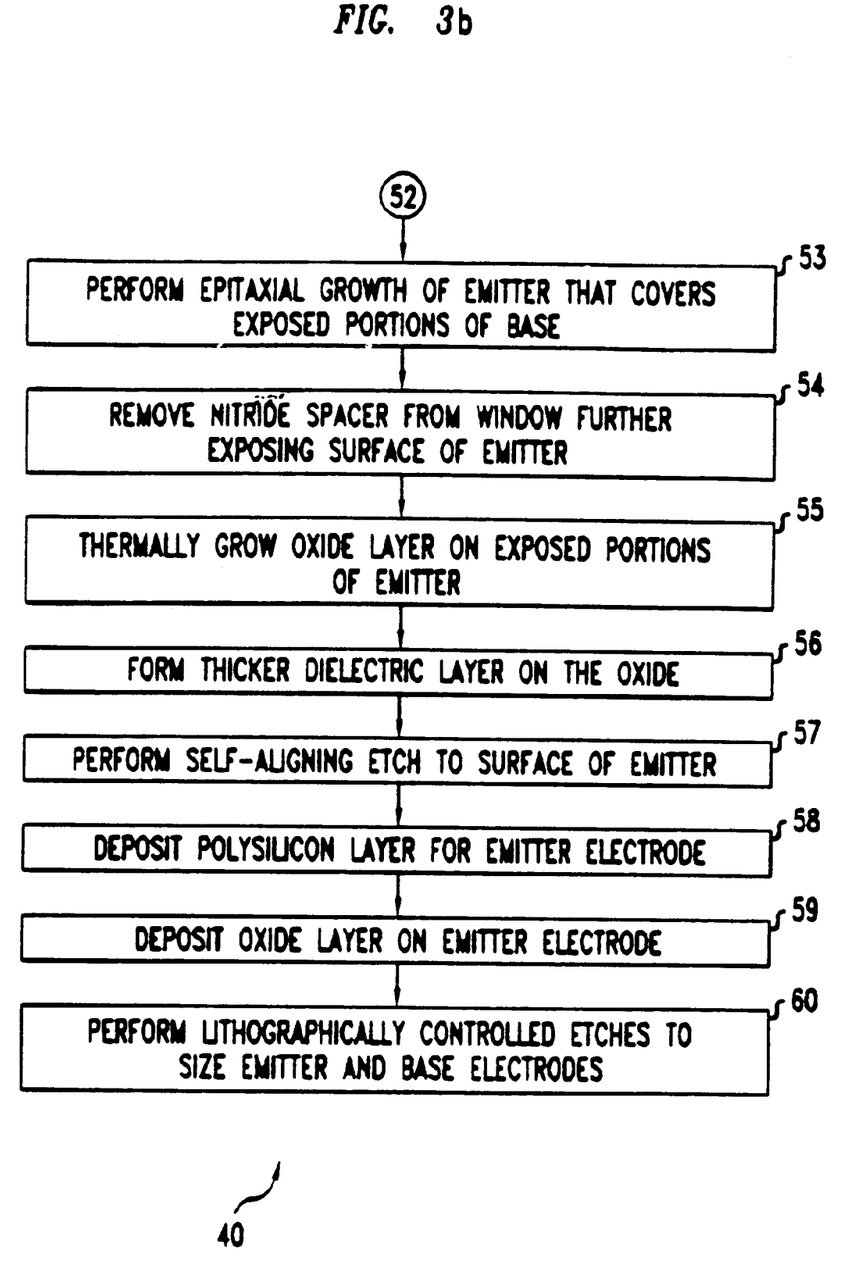

FIGS. 3A–3B are a flow chart showing a process 40 for fabricating the HBT 10 shown in FIGS. 1A–1B. Intermediate structures of the process 40 are shown in cross-sectional views of FIGS. 4A–4K.

Figure 4A:
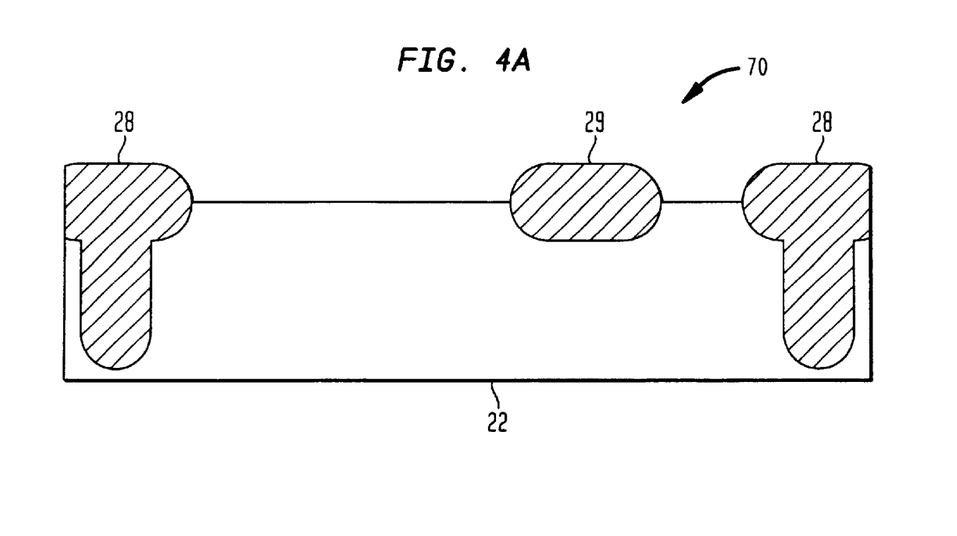
FIG. 4A shows a starting structure for making the NPN HBT of FIGS. 1A–1B.

FIG. 4A shows a starting structure 70 from which process 40 constructs the NPN transistor 10 of FIG. 1. The structure 70 is laterally isolated from other structures (not shown) in the substrate 22 by a deep silicon dioxide trench 28 and separated into two regions by a shallower silicon dioxide structure 29.

Figure 4B:
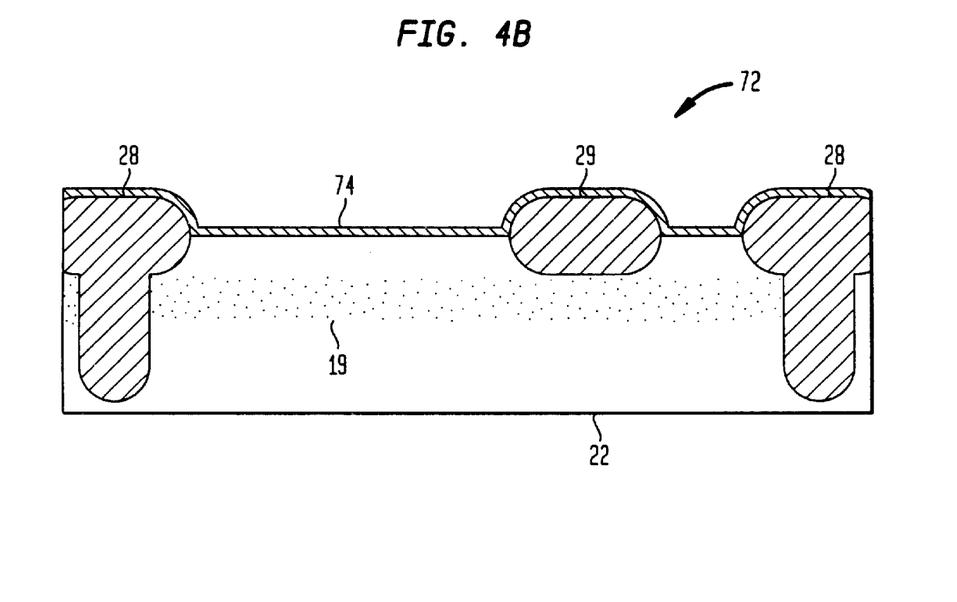
FIG. 4B shows a subcollector structure produced from the structure of FIG. 4A by an ion implantation of N-type dopants.

Referring to FIG. 4B, process 40 produces a structure 72 with a buried N-type subcollector structure 19 from structure 70 of FIG. 4A. To form the structure 72, the process 40 first performs a low-pressure chemical vapor deposition (LPCVD) of silicon dioxide layer 74 to a thickness of about 18 nm. The silicon dioxide layer 74 is produced by decomposing tetraethylorthosilicate (TEOS) at about 650° C. After depositing layer 74, the process 40 performs an ion implantation through the oxide to form the subcollector structure 19 (step 41). The ion implantation uses a dose of about $4 \times 10^{14}$ phosphorus atoms per $cm^2$ of surface area of the original structure 70. The average ion-energy is about 900 kilo-electron-volts (keV). After the implant, a rapid thermal anneal removes the implant-caused defects and activates the implanted phosphorus atoms.

Figure 4C:
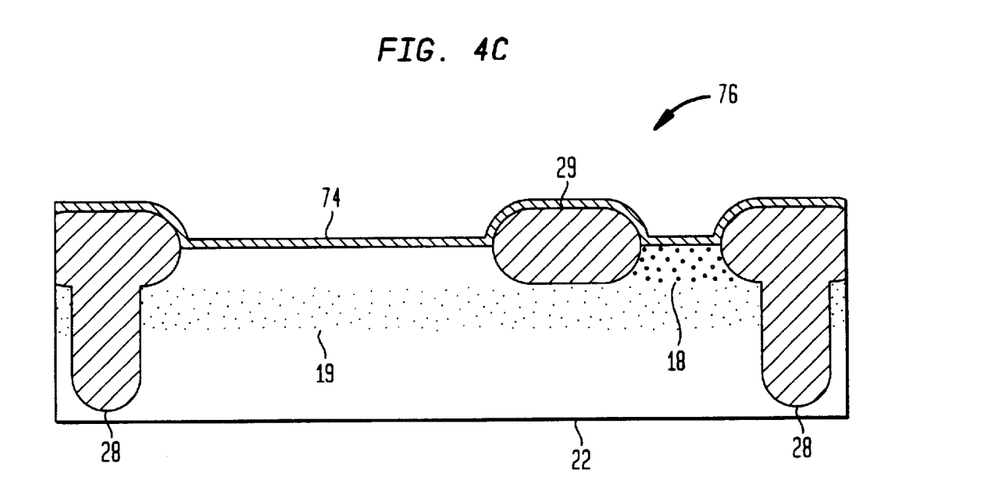
FIG. 4C shows a structure with a collector contact produced from the structure of FIG. 4B.

Referring to FIG. 4C, process 40 produces a structure 76 from structure 72 of FIG. 4B. To produce the structure 76, the process 40 ion implants N-type dopants, e.g., phosphorus atoms, to form collector contact region 18 between oxide trenches 29 and 28 (step 42). The ion implantation is controlled by lithography. After the implantation, process 40 performs a rapid thermal anneal at about 1000° C. for about 5 seconds and in a nitrogen atmosphere. The anneal activates the collector contact region 18. After the implantation of the contact region 18, the process 40 etches away oxide layer 74.

In the embodiment of FIG. 1B, the process 40 also implants source and drain structures of device 24, i.e., a field-effect transistor.

Figure 4D:
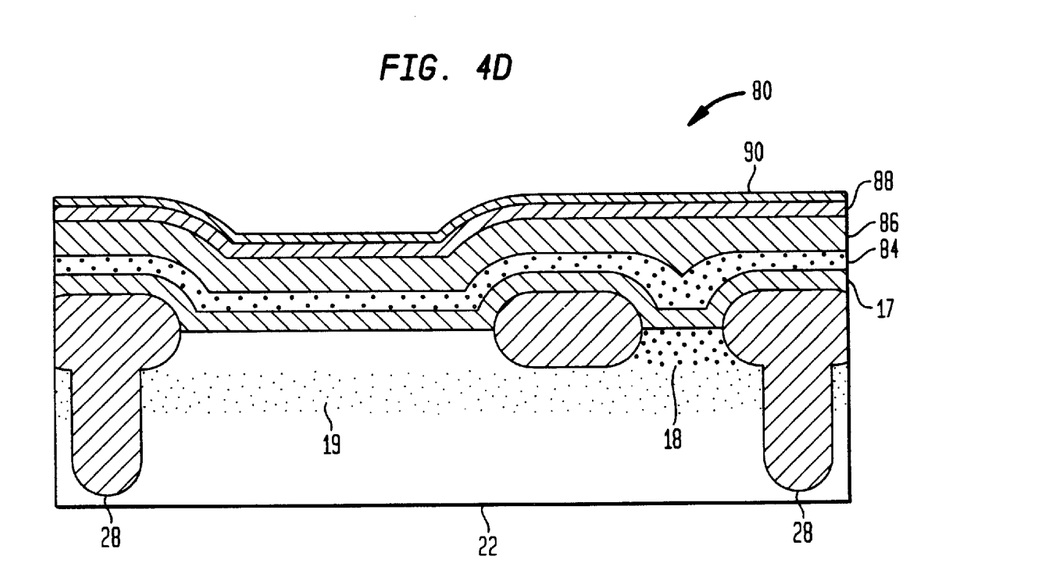
FIG. 4D shows a layered structure produced from the structure of FIG. 4C.

Referring to FIG. 4D, process 40 forms layered structure 80 on structure 76 of FIG. 4C (steps 43–47). The layered-structure 80 includes a silicon dioxide layer 17, a P-type doped polysilicon layer 84, another silicon dioxide layer 86, a silicon nitride layer 88, and an outer silicon dioxide layer 90.

To produce oxide layer 17, process 40 performs a TEOS deposition of an additional 30 nm of silicon dioxide (step 43).

Next, process 40 forms doped polysilicon layer 84 by depositing polysilicon onto oxide layer 17 to a thickness of 200 nm and then, implanting a dose of $5 \times 10^{15}$ Boron (B) ions per $cm^2$ at an energy of 20 keV into the deposited polysilicon (step 44). The P-type doped polysilicon layer 84 will form base electrode 20 of FIGS. 1A–1B.

Doped polysilicon layer 84 is covered by dielectric layers 86, 88, 90. To form the layer 86, process 40 performs a TEOS deposition of oxide to a thickness of 120 nm on the doped polysilicon layer 84 (step 45). To form the nitride layer 88, process 40 performs a LPCVD deposition at 650° C. of nitride to a thickness of 40 nm on the oxide layer 86 (step 46). To form the oxide layer 90, the process 40 performs another TEOS deposition to produce an outer oxide layer 90 with a thickness of 140 nm (step 47).

Figure 4E:
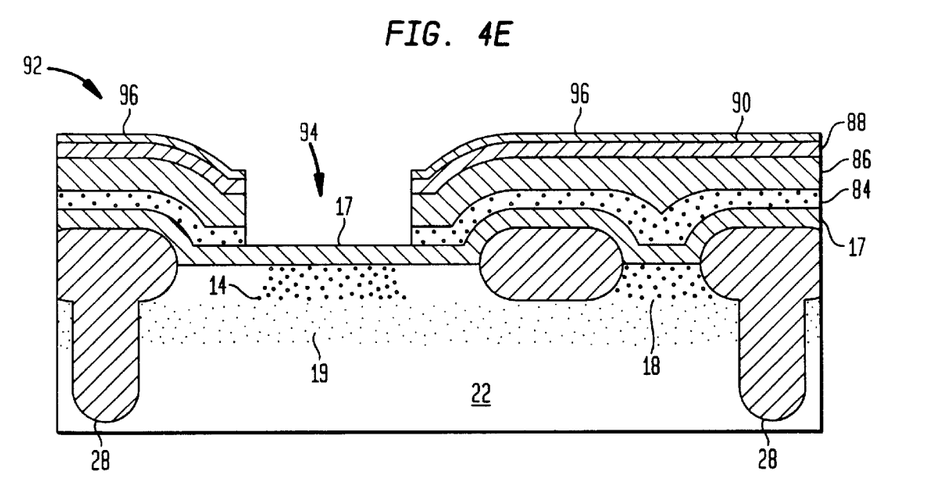
FIG. 4E shows a collector structure produced from the structure of FIG. 4D.

Referring to FIG. 4E, process 40 forms collector structure 92 from layered structure 80 of FIG. 4D. The collector structure 92 has a window 94 and an N-type collector 14 located below the window 94. The collector 14 electrically connects to collector contact region 18 via doped subcollector structure 19.

To produce structure 92, process 40 masks outer surface 96 of layered structure 80 and anisotropically etches through oxide, nitride, and oxide layers 90, 88, 86 to produce window 94 under the control of a lithographic mask (step 48). Then, process 40 implants a dose of about $2 \times 10^{12}$ phosphorus ions per $cm^2$ with energy of about 260 keV through window 94 into substrate 22 to form the collector 14 (step 49). After the implant another thermal anneal activates the collector 14.

Next, process 40 performs a lithographically controlled anisotropic etch of polysilicon layer 84. The etch is either timed or monitored to stop on oxide layer 17. Conventional etchants for the anisotropic etch are well-known to one of skill in the art and are not discussed in detail herein.

Figure 4F:
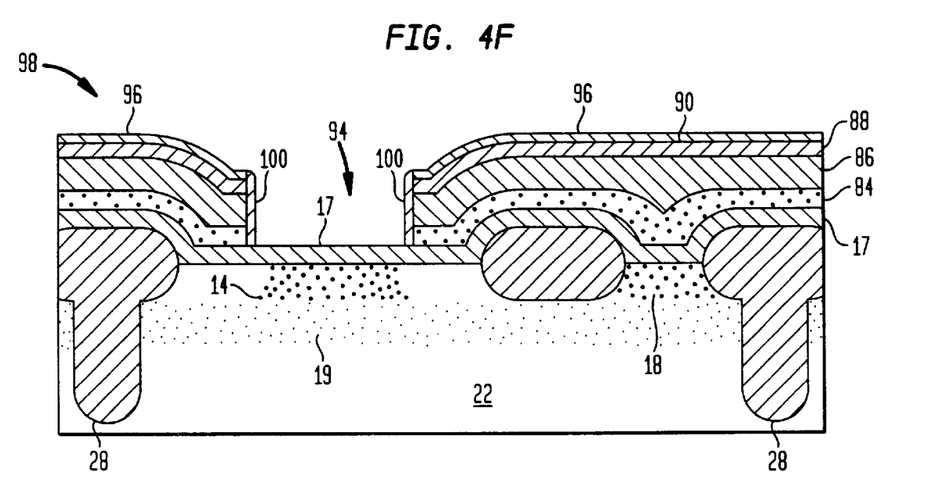
FIG. 4F shows an alignment spacer produced on a portion of the structure of FIG. 4E.
Figure 4G:
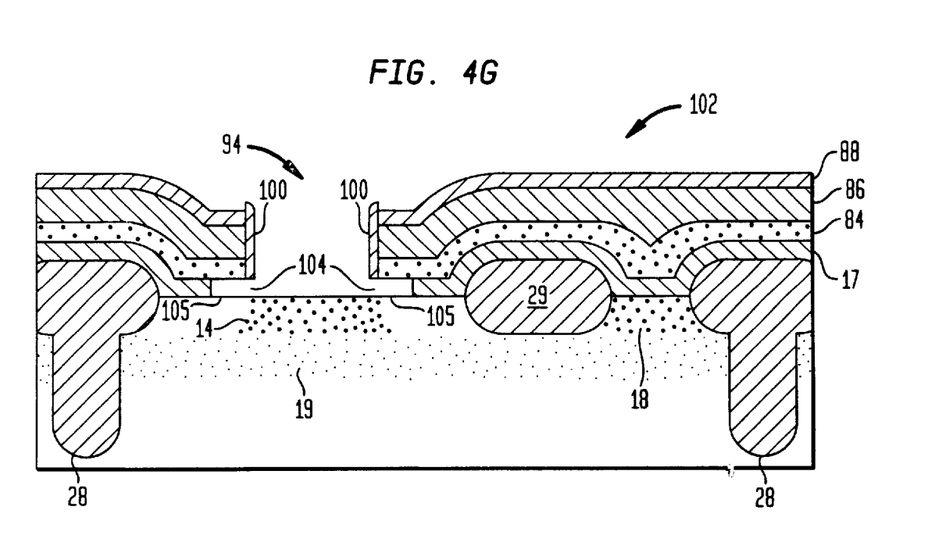
FIG. 4G shows a structure produced by an isotropic etch of the structure of FIG. 4F.

Referring to FIG. 4F, process 40 forms structure 98 by forming a nitride spacer 100 that lines window 94 of FIG. 4E (step 50). To form the spacer 100, the process 40 deposits about 40 nm of silicon nitride, i.e., $Si_3N_4$, on the structure 92 and then, anisotropically etches through the nitride layer. The anisotropic etch is stopped when oxides from layer 90 are detected in material removed by the etch. Referring to FIG. 4G, process 40 forms structure 102 from structure 98 of FIG. 4F. To form structure 102, process 40 performs an isotropic etch of the structure 98 with an aqueous solution of hydrogen fluoride (HF) (step 51). The etching solution has a 50:1 molar ratio of $H_2O$ to HF. The HF etches silicon dioxide of layers 17 and 90, but not the nitride of spacer 100 or layer 88. The HF etch is timed to form an opening 104 that undercuts spacer 100 and provides an access to polysilicon layer 84 via the previously etched window 94.

Figure 4H:
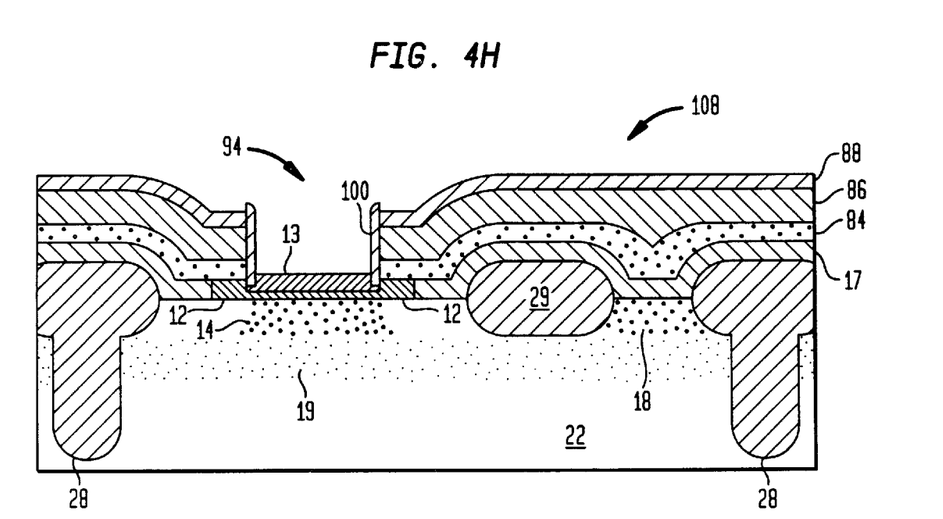
FIG. 4H shows an emitter-base structure produced by epitaxial growths on the collector shown in FIG. 4G.

Referring to FIG. 4H, process 40 grows heterojunction base-emitter structure 108 grown on the structure 102 of FIG. 4G. The base-emitter structure 108 includes graded crystalline Si—Ge base 12 and crystalline Si emitter 13 of FIGS. 1A–1B. The base 12 has a low enough Ge molar fraction "x", i.e., $0.1 < x < 0.6$, and is thin enough, i.e., 3–70 nm thick, to have a strained Si—Ge crystal structure with horizontal lattice constants that match those of the crystalline Si emitter 13 and collector 14.

In one exemplary HBT, the molar fraction "x" of Ge varies from about 0.35 near the base-collector interface to 0.25 at the base-emitter interface.

In another exemplary HBT, the molar fraction x is about equal to 0.30 and uniform across the width of base 12.

To produce base-emitter structure 108, process 40 performs a gaseous epitaxial growth of base 12 on collector 14 (step 52) and a gaseous epitaxial growth of emitter 13 on already grown base 12 (step 53). During growth of the base 12, the epitaxy uses a gas bath that includes germanium, silicon, and P-type dopant atoms, e.g., boron. The molar percentage of Ge in the bath is varied to grade the Ge fraction "x" in the base 12. During growth of the emitter 13, the gas bath includes only silicon and N-type dopants, e.g., As atoms. The second epitaxy aligns the growth of the Si emitter 13 to entirely cover 32 exposed portions of the Si—Ge base 12.

In emitter-base structure 108, Si surfaces of emitter 13 remain exposed and surfaces of base 12 are covered. The base 12 has surfaces physically contacting N-type Si collector 14; P-type polysilicon layer 84, N-type emitter 13, and a small portion of oxide layer 17. No part of the base 12 physically contacts the remaining nitride spacer 100 or remains accessible to window 94, because the emitter 13 is grown to cover the base 12 and fill a gap between the base 12 and the nitride spacer 100. The lateral contact between the base 12 and the oxide layer 17 does not significantly affect carrier recombination in the base 12, because the contact is separated by a large distance from base regions sandwiched between the emitter 13 and the collector 14. The distance is at least 2–4 times the maximum base thickness.

Figure 4I:
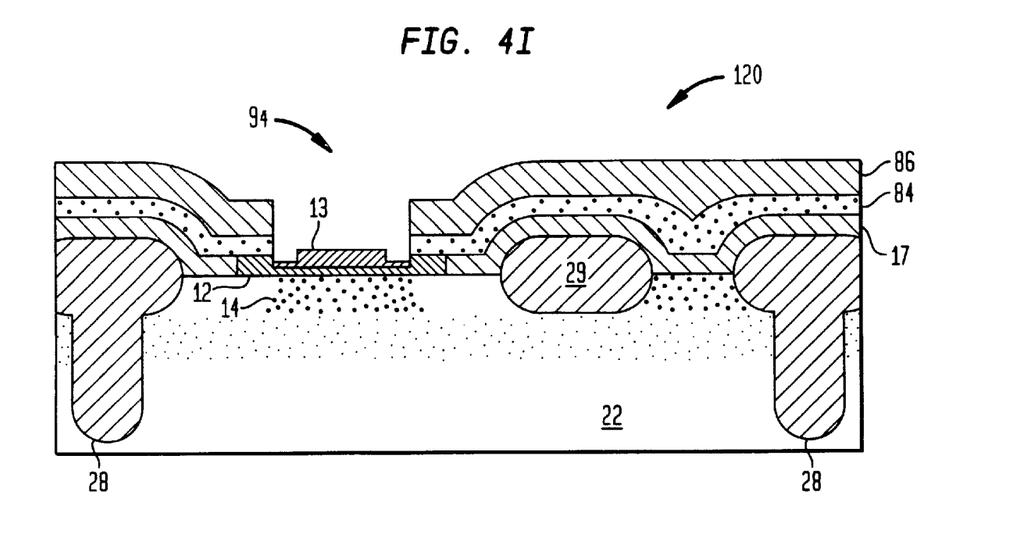
FIG. 4I shows an emitter-base structure resulting from removal of the alignment spacer from the structure of FIG. 4H.

Referring to FIG. 4I, process 40 forms structure 120 from emitter-base structure 108 of FIG. 4H. To produce structure 120, process 40 performs an isotropic etch selective for nitride to remove nitride spacer 100 from window 94 and further expose the upper surface of emitter 13 (step 54). The selective etch also removes nitride layer 88, but does not remove oxide layer 86, polysilicon layer 84, or Si emitter 13. The selective etch does not expose the base 12, because the earlier growth of the emitter 13 has entirely covered portions of the base 12 previously accessible from the window 94.

Figure 4J:
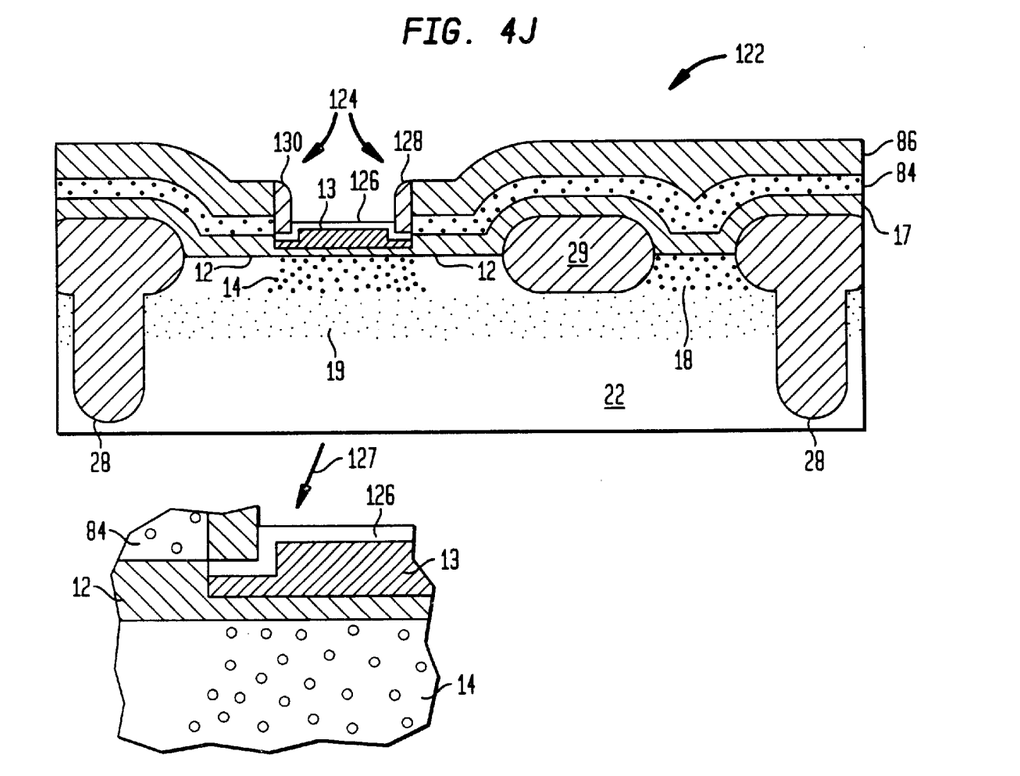
FIG. 4J shows a structure produced from the structure of FIG. 4I by growing an oxide passifying layer on the emitter surface followed by forming a self-aligning dielectric spacer.

Referring to FIG. 4J, process 40 forms passified structure 122 from structure 120 of FIG. 4I. The structure 122 includes a self-aligning sidewall spacer 124 and a passifying layer 126. The relation between the passifying layer 126, emitter 13, and base 12 is more clearly seen in insert 127, which is a magnified view of part of structure 122.

To form spacer 124, process 40 thermally grows a silicon dioxide passifying layer 126, i.e., layer 15 of FIGS. 1A–1B, to a thickness of 1–20 nm on exposed surfaces of Si emitter 13 (step 55). The silicon dioxide layer 126 passifies the emitter's exposed surface with respect to carrier generation and recombination. The thermal oxide layer 126 may be formed by heating the structure 120 for 20 minutes at a low temperature of about 200–600° C. and in a high oxygen pressure of about 10–25 atmospheres. The thermal oxide layer 126 may also be formed by heating at a higher temperature of about 700–750° C. for about 1–2 minutes and in a lower steam pressure of about 1 atmosphere.

After forming thermal oxide layer 126, process 40 deposits a dielectric layer on the thermal oxide layer 126 (step 56). In one embodiment, the thermal oxide layer 126 is about 3 nm thick and, the dielectric layer includes a 20–40 nm thick layer of TEOS oxide under a 30–100 nm layer of silicon nitride. After depositing the dielectric layer, the process 40 performs an anisotropic etch, which is selective to the dielectric, through the dielectric and oxide to the surface of emitter 13 (step 57). Due to the selectivity of the etch, the dielectric layer self-aligns the emitter and base, which leaves a dielectric spacer 128 having a wider base and thinner curved top 130 characteristic of self-aligning spacers.

Figure 4K:
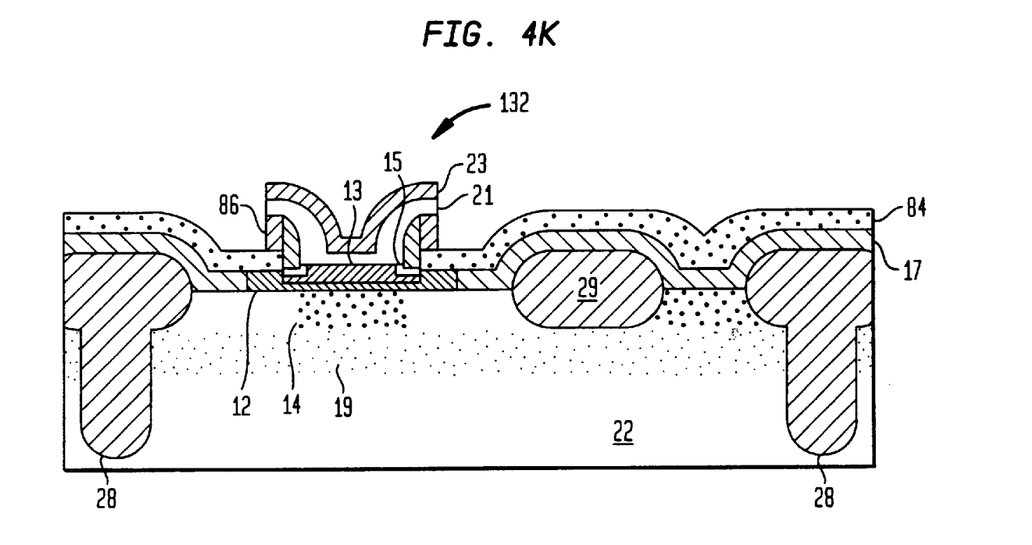
FIG. 4K shows a HBT structure produced by forming an emitter electrode on the structure of FIG. 4J and then, laterally sizing the formed electrode.

Referring to FIG. 4K, process 40 forms NPN transistor structure 132 from structure 122 of FIG. 4J. To produce structure 132, process 40 performs an aqueous isotropic etch with a solution having a 200:1 molar ratio of $H_2O$:HF for about 1 minute to remove oxide from a portion of the surface of emitter 13. Then, process 40 deposits N-type polysilicon for emitter electrode 21 of FIGS. 1A–1B (step 58). The polysilicon is N-type doped in-situ with As. The process 40 optionally performs a TEOS deposition of a protective oxide layer 23 over the emitter electrode 21 (step 59).

The process 40 performs a series of lithographically controlled, anisotropic etches to properly size lateral extents of base and emitter electrodes 20, 21 as shown in FIGS. 1A–1B (step 60). The first etch removes portions of oxide layer 23, emitter electrode 21, and oxide layer 86 extending laterally with respect to spacer 124 under control of a first mask. A second anisotropic etch oxide layer is controlled by a second mask and removes excess lateral portions of the base electrode 21 to produce the final transistor 10 shown in FIGS. 1A–1B.

After laterally sizing base and emitter electrodes 20, 21, HBT 10 is connected to other devices 24 and/or other devices are added to substrate 22 to form an integrated circuit. The integrated circuit is covered with one or more dielectric protect layers and connection pads are made to electrodes of the HBT 10 and/or other devices 24 by methods know to those of skill in the art. In such integrated circuits, the graded Si/Si—Ge HBT 10 may operate at switching frequencies of 40–300 giga-Hertz.

In other embodiments, the vertical structure of HBT 10 is reversed so that substrate 22 contains an N-type emitter region, and P-type base and N-type collector regions are constructed on the emitter region by processes similar to those described by FIGS. 2A–4K.

Some embodiments make PNP-type HBTs with a structure that is similar to that of the NPN-type HBT 10 of FIG. 1 except that P-type and N-type dopants are interchanged. In some such PNP-type HBTs, regions of the emitter and collector are graded with Ge adjacent the base. Then, the percentage of Ge varies from zero to the constant value found in the base over these regions of the collector and emitter, which are thinner than the base. The grading of germanium percentages in these regions of the emitter and collector increases the PNP-type HBT's overall gain. The PNP-type HBTs are constructed by processes that would be obvious to one of skill in the art from the above disclosure.

Other embodiments of the invention will be apparent to those skilled in the art in light of the specification, drawings, and claims of this application.

What is claimed is:

1. A process for fabricating a semiconductor device, comprising:
    forming one or more layers on a semiconductor substrate;
    forming a window in the one or more layers to expose a portion of the substrate through the window;
    forming a silicon-germanium base region on the exposed portion of the substrate;
    forming an emitter or collector region to cover the silicon-germanium base region; and
    forming an oxide layer that covers the emitter or collector region;
    forming a dielectric layer on the oxide layer to produce a structure having a composition capable of self-aligning an anisotropic etch; and
    forming a contact area on the emitter or collector region by removing a portion of the oxide layer.

2. The process of claim 1, further comprising:
    forming the other of an emitter or collector region in said substrate prior to the forming a silicon-germanium base region.

3. The process of claim 2, wherein the base region has a higher dopant concentration than either the emitter region or the collector region.

4. The process of claim 2, wherein the base region contacts a dielectric outside a contact region; and
    wherein the contact region includes a region of physical contact between the collector region and base region and between the emitter region and the base region, and the contact region extends outward from the region of physical contact to a distance of at least twice the thickness of the base region.

5. The process of claim 1, wherein the emitter or collector region and the base region are formed by epitaxial growth.

6. The process of claim 1, wherein the another dielectric layer is a nitride layer.

7. The process of claim 1, wherein the oxide layer is formed by thermal oxidation.

8. The process of claim 1, wherein the forming an oxide layer does not oxidize material of the silicon-germanium base region.

9. A bipolar transistor, comprising:
    an emitter or collector region of doped silicon;
    a base region including silicon-germanium and forming a heterojunction with the emitter or collector region;
    a spacer being positioned to electrically insulate the emitter or collector region from an external region, the spacer having a silicon dioxide layer physically interposed between the emitter or collector region and a second dielectric forming the remainder of the spacer and wherein the base region does not contact the remainder of the spacer.

10. The transistor of claim 9, further comprising:
    the remaining of an emitter or collector region, a portion of the base region being located between the emitter region and the collector region.

11. The transistor of claim 10, wherein a portion of the emitter or collector region is interposed between the base region and the spacer.

12. The transistor of claim 10, wherein the base region has a dopant concentration that is higher than the dopant concentration in the emitter region.

13. The transistor of claim 10, wherein the emitter or collector region forms a structure aligned on the base region.

14. The transistor of claim 13, wherein the self-aligned structure comprises:
    a nitride layer located adjacent the silicon dioxide layer.

15. The transistor of claim 10, wherein the base region has a dopant concentration that is higher than the dopant concentration of the emitter or collector regions.

16. The transistor of claim 10, wherein the silicon dioxide layer is a thermally grown silicon dioxide.

17. The transistor of claim 10, wherein the base, emitter, and collector regions are P-type, N-type, and N-type regions, respectively.

18. The transistor of claim 9, wherein the second dielectric includes a nitride.

* * * * *